(12) United States Patent
Park et al.

(10) Patent No.: US 10,269,836 B2
(45) Date of Patent: Apr. 23, 2019

(54) DISPLAY APPARATUS AND METHOD OF MANUFACTURING THE SAME

(71) Applicant: Samsung Display Co., Ltd., Yongin-si, Gyeonggi-do (KR)

(72) Inventors: JeongMin Park, Seoul (KR); Jung-Soo Lee, Seoul (KR); Ji-Hyun Kim, Seoul (KR); Sanggab Kim, Seoul (KR)

(73) Assignee: Samsung Display Co., Ltd. (KR)

( * ) Notice: Subject to any disclaimer, the term of this patent is extended or adjusted under 35 U.S.C. 154(b) by 324 days.

(21) Appl. No.: 15/340,703

(22) Filed: Nov. 1, 2016

(65) Prior Publication Data

US 2017/0047360 A1 Feb. 16, 2017

Related U.S. Application Data

(62) Division of application No. 13/244,003, filed on Sep. 23, 2011, now abandoned.

(30) Foreign Application Priority Data

Mar. 23, 2011 (KR) .................. 10-2011-0026051

(51) Int. Cl.
*H01L 27/12* (2006.01)
*G02F 1/1362* (2006.01)
*G02F 1/1333* (2006.01)

(52) U.S. Cl.
CPC ........ *H01L 27/1288* (2013.01); *G02F 1/1333* (2013.01); *G02F 1/1362* (2013.01); *H01L 27/124* (2013.01); *H01L 27/127* (2013.01); *G02F 2001/136231* (2013.01); *G02F 2001/136236* (2013.01)

(58) Field of Classification Search
CPC .. H01L 27/1288; H01L 27/127; H01L 27/124
See application file for complete search history.

(56) References Cited

U.S. PATENT DOCUMENTS

| 6,309,903 B2 | 10/2001 | Shin et al. |
| 6,624,864 B1 | 9/2003 | Kubo et al. |
| 6,774,975 B2 | 8/2004 | Ahn |

(Continued)

FOREIGN PATENT DOCUMENTS

| JP | 2001-221992 | 8/2001 |
| JP | 2007292976 A | 11/2007 |

(Continued)

*Primary Examiner* — David Vu
(74) *Attorney, Agent, or Firm* — Innovation Counsel LLP

(57) ABSTRACT

A display apparatus includes a substrate and a plurality of pixels disposed on the substrate. Each pixel includes a gate electrode on the substrate, a common electrode insulated from the gate electrode on the substrate, a first insulating layer covering the gate electrode and the common electrode, a semiconductor pattern disposed on the first insulating layer to overlap with the gate electrode, source and drain electrodes disposed on the semiconductor pattern and spaced apart from each other, and a pixel electrode disposed on the first insulating layer to cover the drain electrode and form an electric field with the common electrode. The display apparatus may be manufactured by first to fourth photolithography processes using first to fourth masks, and the first mask may be a slit mask or a diffraction mask.

11 Claims, 16 Drawing Sheets

(56) References Cited

U.S. PATENT DOCUMENTS

| | | | |
|---|---|---|---|
| 6,833,896 B2 | 12/2004 | Lee | |
| 7,102,718 B1 | 9/2006 | Yamazaki et al. | |
| 7,167,217 B2 | 1/2007 | Yun | |
| 8,198,111 B2 * | 6/2012 | Kim | G02F 1/136286 257/E21.214 |
| 8,603,914 B2 | 12/2013 | Song | |
| 2001/0013915 A1 | 8/2001 | Song | |
| 2002/0074549 A1 | 6/2002 | Park et al. | |
| 2006/0145154 A1 | 7/2006 | Choi et al. | |
| 2006/0146246 A1 | 7/2006 | Choo | |
| 2007/0002259 A1 | 1/2007 | SangChul et al. | |
| 2007/0114625 A1 | 5/2007 | Hsiao et al. | |
| 2007/0153204 A1 | 7/2007 | Kim et al. | |
| 2008/0001177 A1 | 1/2008 | Kim et al. | |
| 2008/0303024 A1 | 12/2008 | Song et al. | |
| 2009/0236604 A1 | 9/2009 | Bae et al. | |
| 2010/0128192 A1 | 5/2010 | Kim et al. | |
| 2010/0225869 A1 | 9/2010 | Ahn et al. | |

FOREIGN PATENT DOCUMENTS

| | | |
|---|---|---|
| KR | 1020010063292 A | 7/2001 |
| KR | 20010084454 A | 9/2001 |
| KR | 20010090461 A | 10/2001 |
| KR | 1020020066573 A | 8/2002 |
| KR | 1020080001104 A | 1/2008 |
| KR | 20080080855 A | 9/2008 |

\* cited by examiner

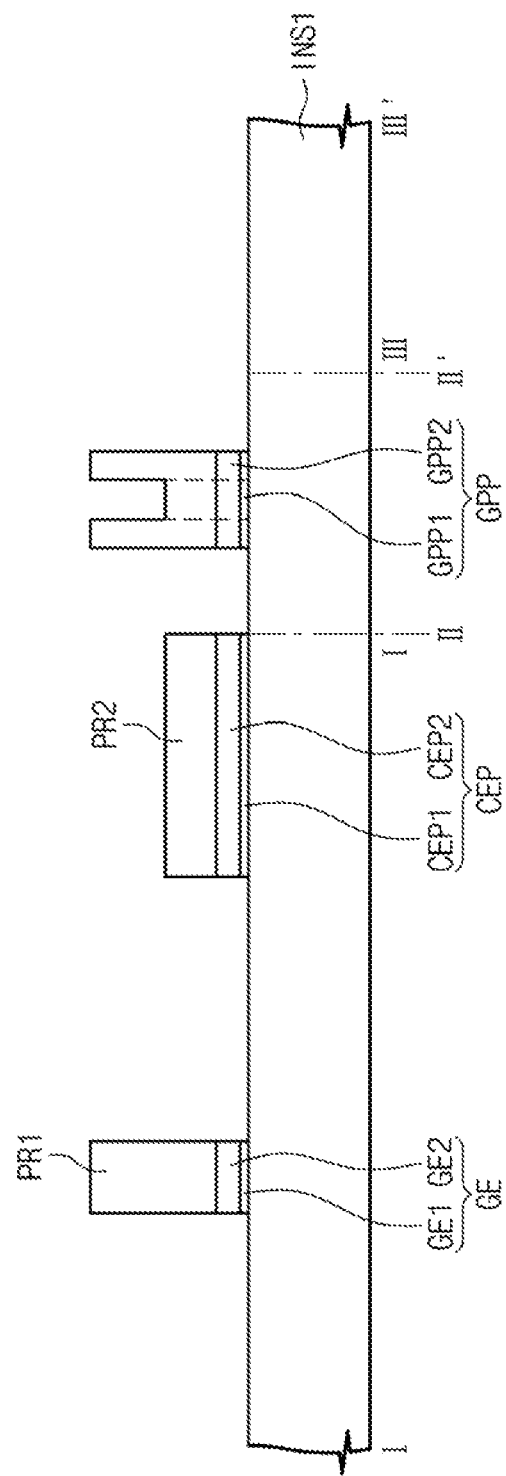

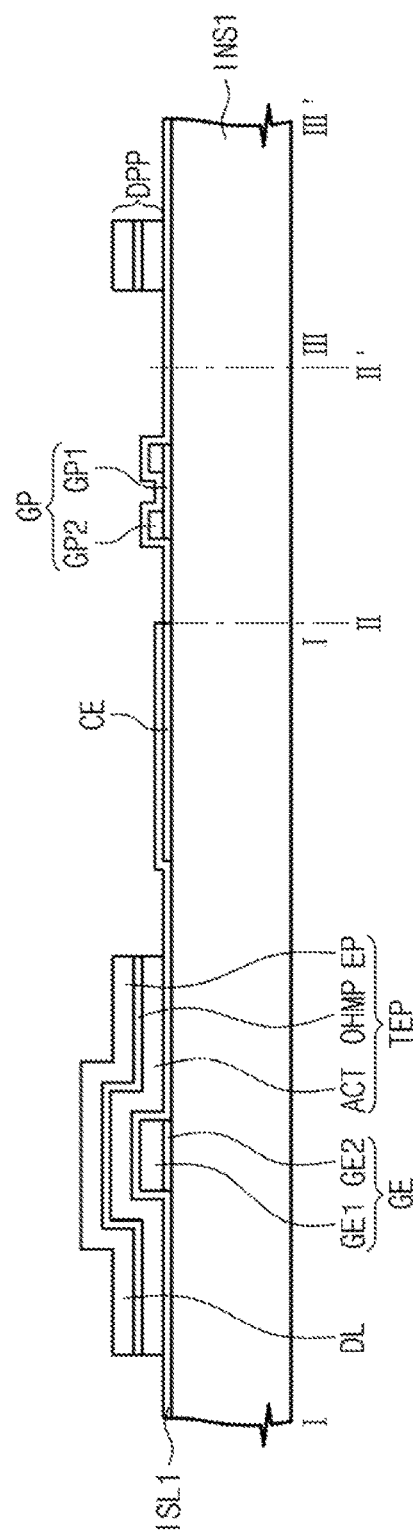

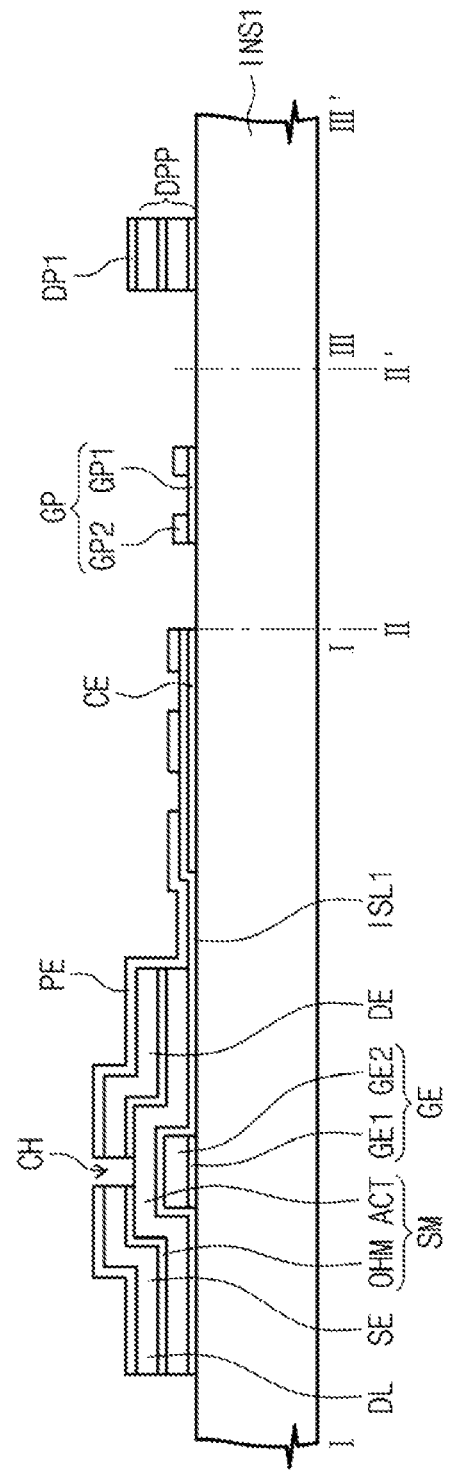

DISPLAY APPARATUS AND METHOD OF MANUFACTURING THE SAME

CROSS-REFERENCE TO RELATED APPLICATION

This application is a divisional application which claims priority to and the benefit of U.S. patent application Ser. No. 13/244,003 filed on Sep. 23, 2011, which claims priority to and the benefit of Korean Patent Application No. 10-2011-0026051 filed on Mar. 23, 2011, the contents of which are herein incorporated by reference in their entirety.

BACKGROUND

1. Field of Disclosure

The present invention relates to a display apparatus and a method of manufacturing the same. More particularly, the present invention relates to a plane-to-line switching (PLS) mode display apparatus and a method of manufacturing the display apparatus.

2. Description of the Related Art

A liquid crystal display includes a liquid crystal layer. Based on the driving method of the liquid crystal layer in the display, liquid crystal displays are classified into in-plane switching (IPS) mode liquid crystal displays, vertical alignment (VA) mode liquid crystal displays, and plane-to-line switching (PLS) mode liquid crystal displays.

The PLS mode liquid crystal display drives the liquid crystal layer using a horizontal electric field and a vertical electric field. The liquid crystal molecules in the liquid crystal layer of the PLS mode liquid crystal display are rotated in parallel to the plane of the substrate to display an image.

SUMMARY

A display apparatus with a simplified manufacturing process and reduced manufacturing cost is provided.

A method of manufacturing the display apparatus is also provided.

A display apparatus includes a substrate and a plurality of pixels disposed on the substrate. Each pixel includes a gate electrode disposed on the substrate, a common electrode disposed on the substrate and insulated from the gate electrode, a first insulating layer covering the gate electrode and the common electrode, a semiconductor pattern disposed on the first insulating layer to overlap with the gate electrode, a source electrode disposed on the semiconductor pattern, a drain electrode disposed on the semiconductor pattern and spaced apart from the source electrode, and a pixel electrode disposed on the first insulating layer to cover the drain electrode and configured to form an electric field with the common electrode.

The display apparatus further includes a passivation layer. In addition, the semiconductor pattern include a channel portion corresponding to an area between the source electrode and the drain electrode and having an upper surface that is exposed, and the passivation layer covers the channel portion.

The pixel electrode includes a trunk portion and a plurality of branch portions protruded from the trunk portion and spaced apart from each other.

A plurality of gate lines is disposed on the substrate and extended in a first direction and a plurality of data lines is extended in a second direction crossing the first direction. The first insulating layer is interposed between the gate lines and the data lines. Each of the pixels is connected to an adjacent gate line and an adjacent data line.

The substrate includes a display area in which the pixels are arranged to display an image and a pad area positioned adjacent to at least one side of the display area, and further includes a gate pad disposed in the pad area and connected to one of the gate lines and a data pad disposed in the pad area and connected to one of the data lines.

The display apparatus may be manufactured by the following first to fourth photolithography processes.

A first photolithography process is performed using a first mask to form a first wire pattern including a gate line, a gate electrode, and a common electrode on a substrate. An insulating layer is formed on the substrate to cover the first wire pattern, and a second photolithography process is performed using a second mask to form a second wire pattern including a data line and a thin film transistor electrode pattern are formed on the insulating layer. A third photolithography process is performed using a third mask to form a third wire pattern including a source electrode, a drain electrode, and a pixel electrode on the substrate and form a channel portion between the source electrode and the drain electrode. A fourth photolithography process is performed using a fourth mask to form a passivation layer that covers the channel portion.

The first mask may be at least one of a slit mask and a diffraction mask.

In the first photolithography process, a gate pad connected to the gate line may be formed in the pad area.

In the third photolithography process, a first data pad part connected to the data line may be formed in the pad area.

According to the above, the first substrate may be manufactured by the first to fourth photolithography processes using the first to fourth masks. In addition, the number of the slit masks or diffraction masks used may be reduced, thereby reducing the manufacturing cost.

Further, the additional process of forming the spacer may be omitted, thereby simplifying the manufacturing process of the display apparatus and shortening the process time of the manufacturing method.

BRIEF DESCRIPTION OF THE DRAWINGS

The above and other advantages will become readily apparent by reference to the following detailed description when considered in conjunction with the accompanying drawings wherein:

FIGS. 4B, 4C, 4D, 4E, and 4F are cross-sectional views illustrating the first photolithography process according to the lines I-I' and II-II' of FIG. 4A;

FIG. 5B is a cross-sectional view taken along the lines I-I', II-II, and III-III' shown in FIG. 5A;

FIG. 6B is a cross-sectional view taken along the lines I-I', II-II, and III-III' shown in FIG. 6A;

DETAILED DESCRIPTION

Figure 1:
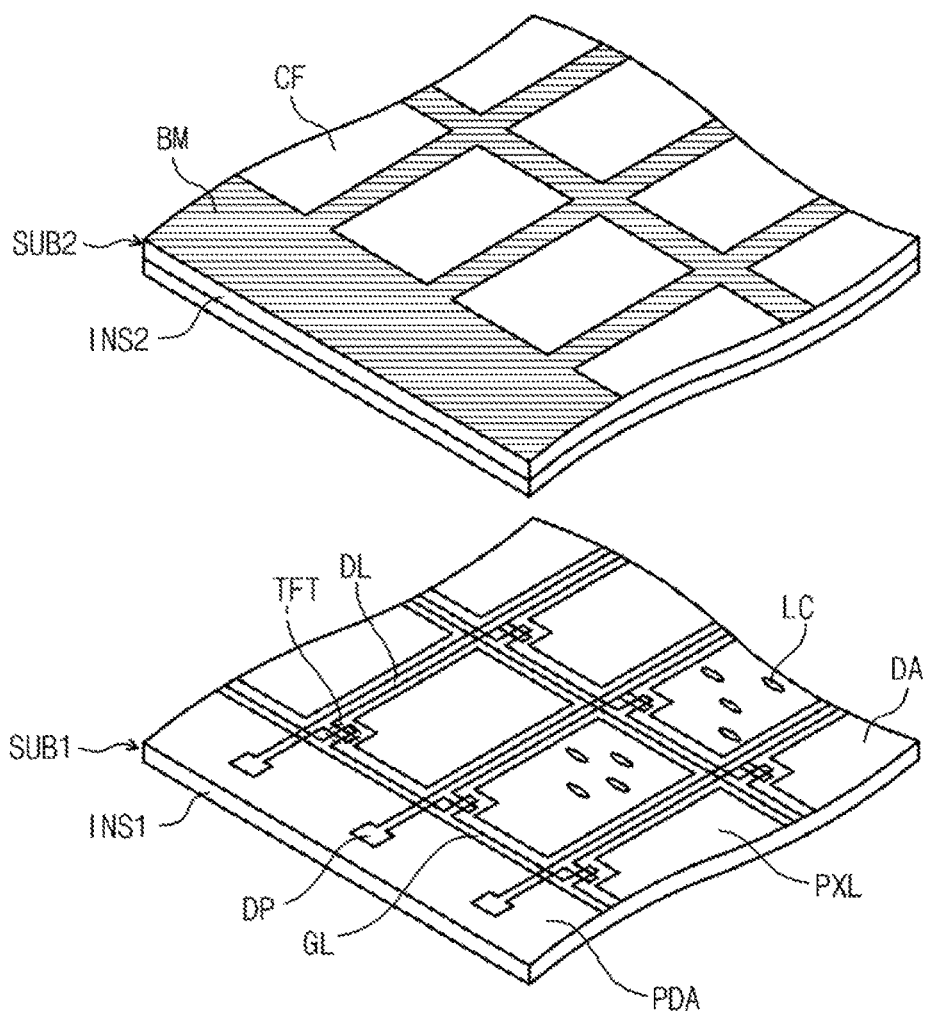
FIG. 1 is an exploded perspective view showing a display apparatus according to an exemplary embodiment.

It will be understood that when an element or layer is referred to as being "on", "connected to" or "coupled to" another element or layer, it can be directly on, connected or coupled to the other element or layer, or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below, depending on the orientation. The device may be otherwise oriented (rotated 90 degrees or at other orientations) and the spatially relative descriptors used herein interpreted accordingly.

The terminology used herein is for the purpose of describing particular embodiments only and is not intended to be limiting. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the relevant art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments will be explained with reference to the accompanying drawings.

Figure 2:
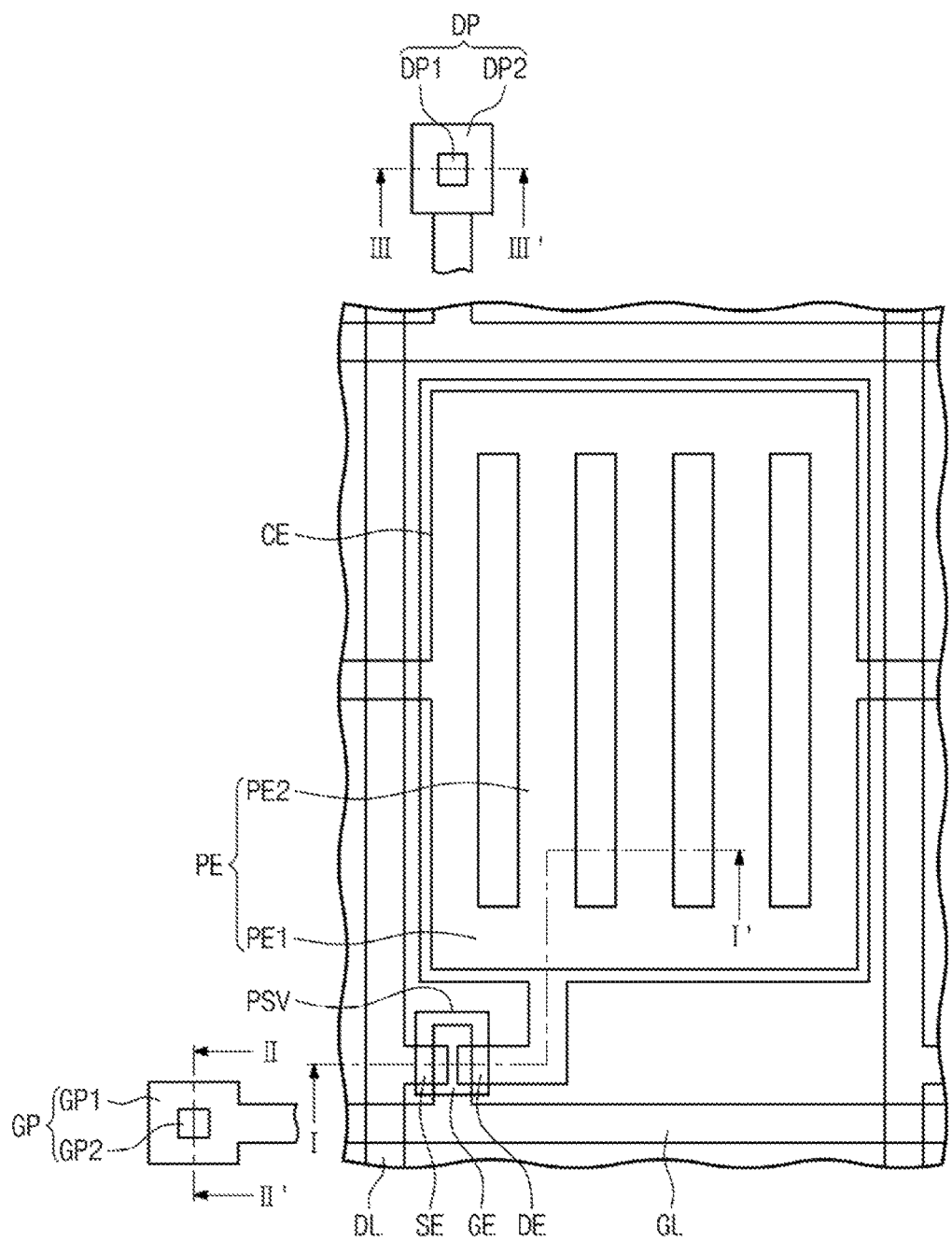
FIG. 2 is a plan view showing a portion of a first substrate of a display apparatus shown in FIG. 1.
Figure 3:
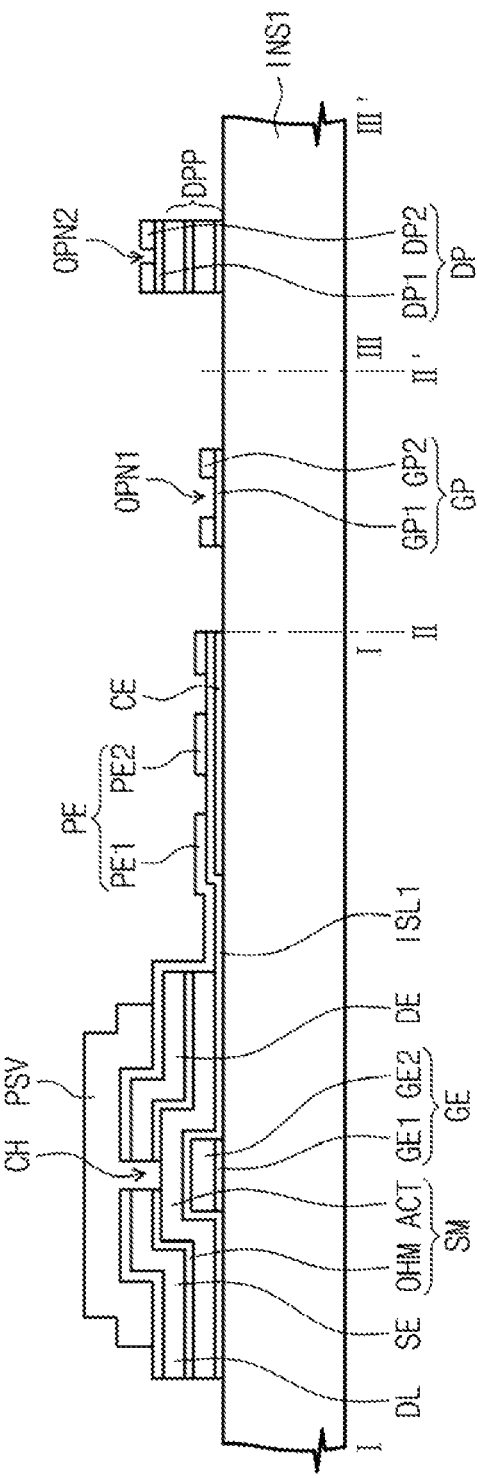
FIG. 3 is a cross-sectional view taken along lines I-I', and of FIG. 2.

FIG. 1 is an exploded perspective view showing a display apparatus according to an exemplary embodiment, FIG. 2 is a plan view showing a portion of a first substrate of a display apparatus shown in FIG. 1, and FIG. 3 is a cross-sectional view taken along lines I-I', II-II', and III-III of FIG. 2.

According to the present exemplary embodiments, the display apparatus includes a plurality of pixels to display an image. The display apparatus may includes various display panels, such as a liquid crystal display, an organic light emitting display panel, an electrophoretic display panel, an electro-wetting display panel, a microelectromechanical system display panel, etc. In the present exemplary embodiment, the liquid crystal display panel will be described as a representative example. Each of the pixels in the display apparatus have the same structure and function, and thus a single pixel and its adjacent gate lines, data lines, and corresponding gate and data pads will be described.

Referring to FIGS. 1 to 3, the display apparatus includes a first substrate SUB1, a second substrate SUB2, and a liquid crystal layer LC disposed between the first substrate SUB1 and the second substrate SUB2.

The first substrate SUB1 includes a first insulating substrate INS1, a plurality of gate lines GL disposed on the first insulating substrate INS1, and a plurality of data lines DL disposed on the first insulating substrate INS1.

The first insulating substrate INS1 includes a pixel area DA in which the pixels PXL are arranged and a pad area PDA positioned adjacent to at least one side of the display area DA.

The gate lines GL and the data lines DL are arranged across the display area DA. The gate lines GL extend in a first direction on the first insulating substrate INS1. A first insulating layer ISL1 (FIG. 3) is disposed on the first insulating substrate INS1 on which the gate lines GL are disposed. The first insulating layer ISL1 may include a first insulating material such as, for example, silicon nitride, silicon oxide, etc.

The data lines DL are disposed on the first insulating layer ISL1 and extend in a second direction that crosses the first direction.

Each pixel PXL is connected to one gate line GL of the two gate lines GL adjacent to the pixel PXL, and one data line DL of the two data lines DL adjacent to the pixel PXL. Each pixel PXL includes a thin film transistor, a common electrode CE, and a pixel electrode PE connected to the thin film transistor.

The thin film transistor includes a gate electrode GE, a semiconductor layer SM, a source electrode SE, a drain electrode DE.

The gate electrode GE is branched off from the gate line GL. The gate electrode GE includes a first gate electrode GE1 disposed on the first insulating substrate INS1 and including a first conductive material, and a second gate electrode GE2 disposed on the first gate electrode GE1 and including a second conductive material. The first conductive material may include, for example, a transparent conductive material, such as indium tin oxide (ITO), an indium zinc oxide (IZO), indium tin zinc oxide (ITZO), etc. The second conductive material may include a metal material, such as, for example, copper (Cu), molybdenum (Mo), aluminum (Al), tungsten (W), chromium (Cr), titanium (Ti), or an alloy thereof.

The semiconductor layer SM is disposed on the gate electrode GE such that the first insulating layer ISL1 is interposed between the semiconductor layer SM and the gate electrode GE. The first insulating layer ISL1 is disposed on an entire surface of the first insulating layer INS1 that is over the gate electrode GE to cover the gate electrode GE.

The semiconductor layer SM includes an active layer ACT disposed on the first insulating layer ISL1 and an ohmic contact layer OHM disposed on the active layer ACT. When viewed in a plan view, the active layer ACT is disposed in an area that is covered by to the source electrode SE and the drain electrode DE and also in an area that is between the source electrode SE and the drain electrode DE. The ohmic contact layer OHM is disposed between the active layer ACT and the source electrode SE and between the active layer ACT and the drain electrode DE, and is not disposed in an area between the source electrode SE and the drain electrode DE.

The source electrode SE is branched off from the data line DL and partially overlaps the gate electrode GE. The drain electrode DE is spaced apart from the source electrode SE and partially overlaps the gate electrode GE. The source electrode SE and the drain electrode DE may include a third conductive material. The third conductive material may be a metal material, such as, for example, copper (Cu), molybdenum (Mo), aluminum (Al), tungsten (W), chromium (Cr), titanium (Ti), or an alloy thereof. That is, the third conductive material may be the same as the second conductive material.

In the present exemplary embodiment, the source electrode SE and the drain electrode DE are overlapped with the semiconductor layer SM except for the area between the source electrode SE and the drain electrode DE. The area between the source electrode SE and the drain electrode DE is used as a channel portion CH, and a portion of an upper surface of the active layer ACT is exposed in the area between the source electrode SE and the drain electrode DE. When the thin film transistor is turned on, current flows through the channel portion CH between the source electrode SE and the drain electrode DE.

A passivation layer PSV is disposed above the source electrode SE and the drain electrode DE to cover the channel portion CH. The passivation layer PSV includes a second insulating material such as, for example, silicon nitride or silicon oxide. The passivation layer PSV may also cover a portion of the source electrode SE and a portion of the drain electrode DE.

The common electrode CE is disposed on the first insulating substrate INS1 and applied with a common voltage. The common electrode CE may include the same material as that of the first conductive layer. That is, the common electrode CE may be formed of the first conductive material, and the first conductive material may be a transparent material, for example, indium tin oxide, indium zinc oxide, indium tin zinc oxide, etc.

The pixel electrode PE is disposed on the drain electrode DE and the first insulating layer ISL1. The pixel electrode PE is electrically connected to the drain electrode DE. The pixel electrode PE directly contacts the upper surface of the drain electrode DE to cover the entire upper surface of the drain electrode DE.

The pixel electrode PE may include a fourth conductive material. The fourth pixel electrode PE may include a transparent conductive material, for example, indium tin oxide, indium zinc oxide, indium tin zinc oxide, etc. In other words, the fourth conductive material may be the same as the first conductive material.

When viewed in a plan view, the pixel electrode PE includes at least one main portion PE1 (hereinafter, referred to as trunk portion) and a plurality of sub-portions PE2 (hereinafter, referred to as branch portions). The branch portions PE2 are arranged to be spaced apart from each other at regular intervals. The branch portions PE2 extend in a predetermined direction to be parallel to each other. In the present exemplary embodiment, the trunk portion PE1 has a closed-rectangular shape and the branch portions PE2 are arranged to extend from one side of the trunk portion PE1 to the other side, and are parallel to the longest side of the closed-rectangle shape of the trunk portion PE1, but they should not be limited thereto or thereby. For instance, the branch portions PE2 may be protruded from the shortest side of the trunk portion PE1 and extended in a direction substantially parallel to a direction in which the longest side of the trunk portion PE1 extends. In addition, the branch portions PE2 may be protruded from the trunk portion PE1 in both directions substantially perpendicular to a direction in which the longest side of the trunk portion PE1 extends. Further, the trunk portion PE1 and the branch portions PE2 may be bent several times, and may extend at various angles.

Gate pads GP are arranged in the pad area PDA to respectively correspond to ends of the gate lines GL, and data pads DP are arranged in the pad area PDA to respectively correspond to ends of the data lines DL. The gate pads GP and the data pad DP are used to connect the gate lines GL and the data lines DL to external wires, thereby allowing signals to be applied to the pixels PXL.

The gate pads GP correspond to the gate lines GL in a one-to-one correspondence, so that each gate line GL has a gate pad GP at the end of the gate line GL. Each gate pad GP includes a first gate pad part GP1 disposed on the first insulating substrate INS1 and a second gate pad part GP2 disposed on the first gate pad part GP1. The second gate pad part GP2 includes a first opening OPN1 to expose a portion of upper surface of the first gate pad part GP1. The first opening OPN1 is formed to prevent contact defects from occurring when external wires are connected to the gate pads GP. The gate pad GP may be electrically connected to the external wires with conductive balls interposed between the gate pad GP and the external wires, and thus the gate pad GP may easily make contact with external wires via the first opening OPN1. In another exemplary embodiment, conductive balls may not be applied to the gate pad GP, so that the first opening OPN1 does not need to be formed in the second gate pad GP2.

The first gate pad part GP1 may include the first conductive material and the second gate pad part GP2 may include the second conductive material. In this case, the gate pad GP and the gate electrode GE may be formed through the same process, for instance in a single process.

The data pads DP are connected to the data lines DL in a one-to-one correspondence, so that each data line DL has a data pad DP at the end of the data line DL. Each data pad DP includes a first data pad part DP1 and a second data pad part DP2 disposed on the first data pad part DP1. The second data pad part DP2 includes a second opening OPN2 to expose a portion of upper surface of the first data pad part DP1. The second opening OPN2 is formed to prevent contact defects from occurring when external wires are connected to the data pads DP. The data pad DP may be electrically connected to the external wires with conductive balls interposed between the data pad DP and the external wires, and thus the data pad DP may easily make contact with external wires via the second opening OPN2. In another exemplary embodiment, the conductive balls may not be applied to the data pad DP, so that the second opening OPN2 does not need to be formed in the second data pad DP2.

The first data pad part DP1 may be formed of the fourth conductive material, and the second data pad part DP2 may be formed of the second conductive material. In this case, the first data pad part DP1 may be formed through the same process used for forming the source electrode SE or the drain electrode DE, and the second data pad part DP2 may be formed together with the passivation layer PSV through the same process.

The second substrate SUB2 includes a second insulating substrate INS2, color filters CF disposed on the second insulating substrate INS2 to display, for instance, red, green, and blue colors, and a black matrix BM disposed between the color filters CF to block certain light passing through the liquid crystal layer LC.

The first substrate SUB1 and/or the second substrate SUB2 includes a spacer (not shown) formed thereon to maintain a distance (i.e., a cell gap) between the first substrate SUB1 and the second substrate SUB2. The liquid crystal layer LC is disposed between the first substrate SUB1 and the second substrate SUB2.

In the above-described display apparatus, the thin film transistor is turned on in response to a driving signal provided through the gate line GL. When the thin film transistor is turned on, an image signal provided through the data line DL is applied to the pixel electrode PE through the thin film transistor. Thus, an electric field is formed between the pixel electrode PE and the common electrode CE, and the liquid crystal molecules in the liquid crystal layer are oriented according to the electric field, thereby displaying the image.

Hereinafter, a method of manufacturing the display apparatus will be described. First, a method of manufacturing the first substrate SUB1 will be described in detail.

According to the present exemplary embodiment, the first substrate SUB1 of the display apparatus may be manufactured through first to fourth photolithography processes using four masks.

Figure 4A:
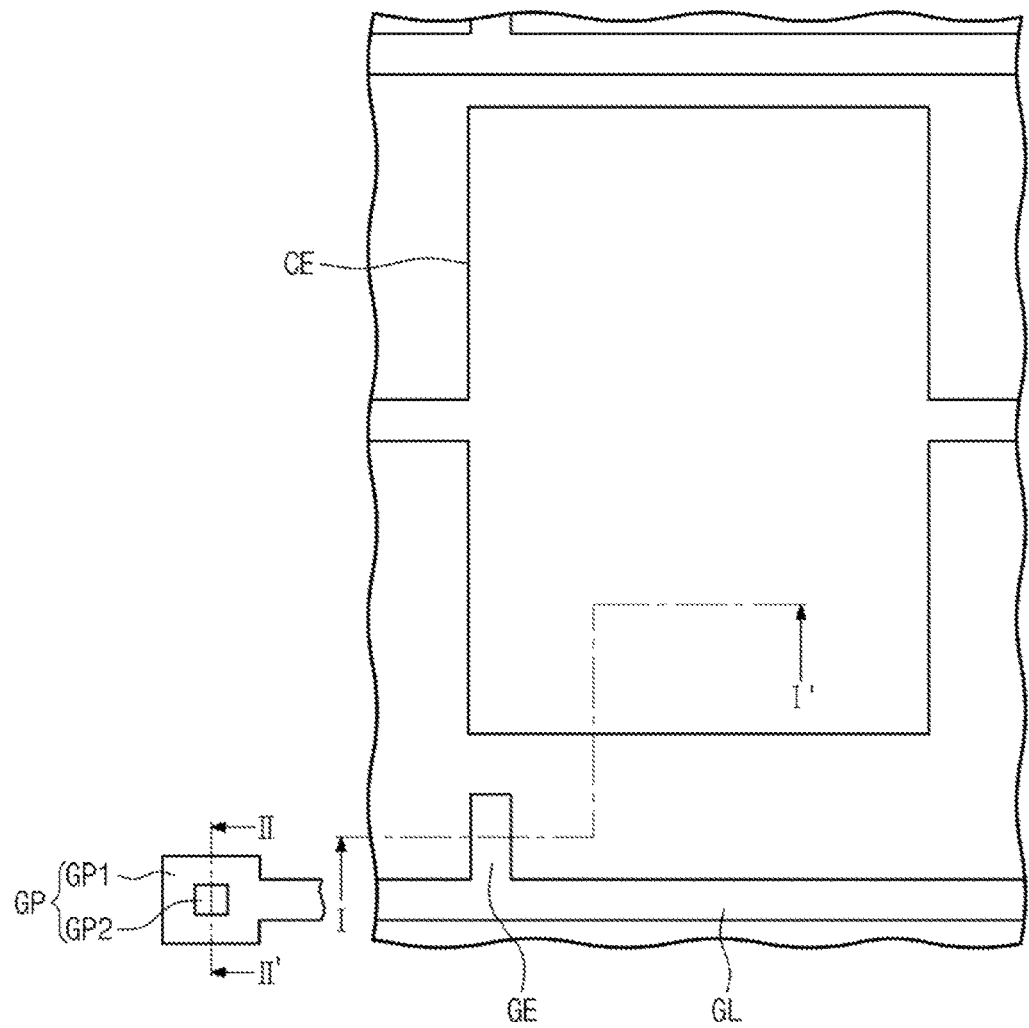
FIG. 4A is a plan view illustrating the result of a first photolithography process of a method of manufacturing a display apparatus shown according to an exemplary embodiment.

FIG. 4A is a plan view illustrating a result of a first photolithography process of a method of manufacturing a display apparatus shown according to an exemplary embodiment, and FIGS. 4B to 4F are cross-sectional views illustrating the first photolithography process according to the lines I-I' and II-II' of FIG. 4A.

Figure 5A:
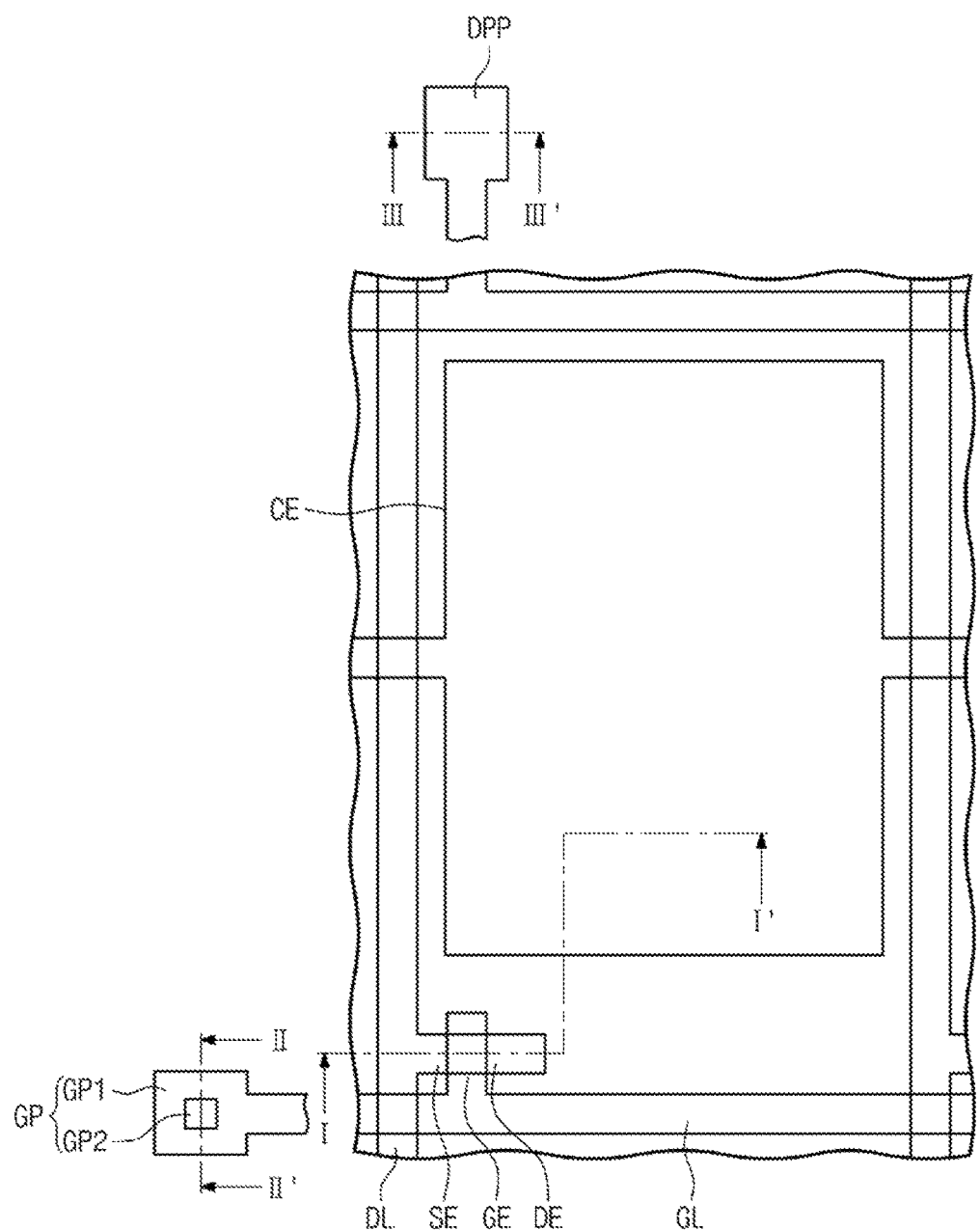
FIG. 5A is a plan view illustrating the result of a second photolithography process of a method of manufacturing a display apparatus according to an exemplary embodiment.

FIG. 5A is a plan view illustrating a result of a second photolithography process of a method of manufacturing a display apparatus according to an exemplary embodiment, and FIG. 5B is a cross-sectional view taken along the lines I-I', II-II, and III-III' shown in FIG. 5A.

Figure 6A:
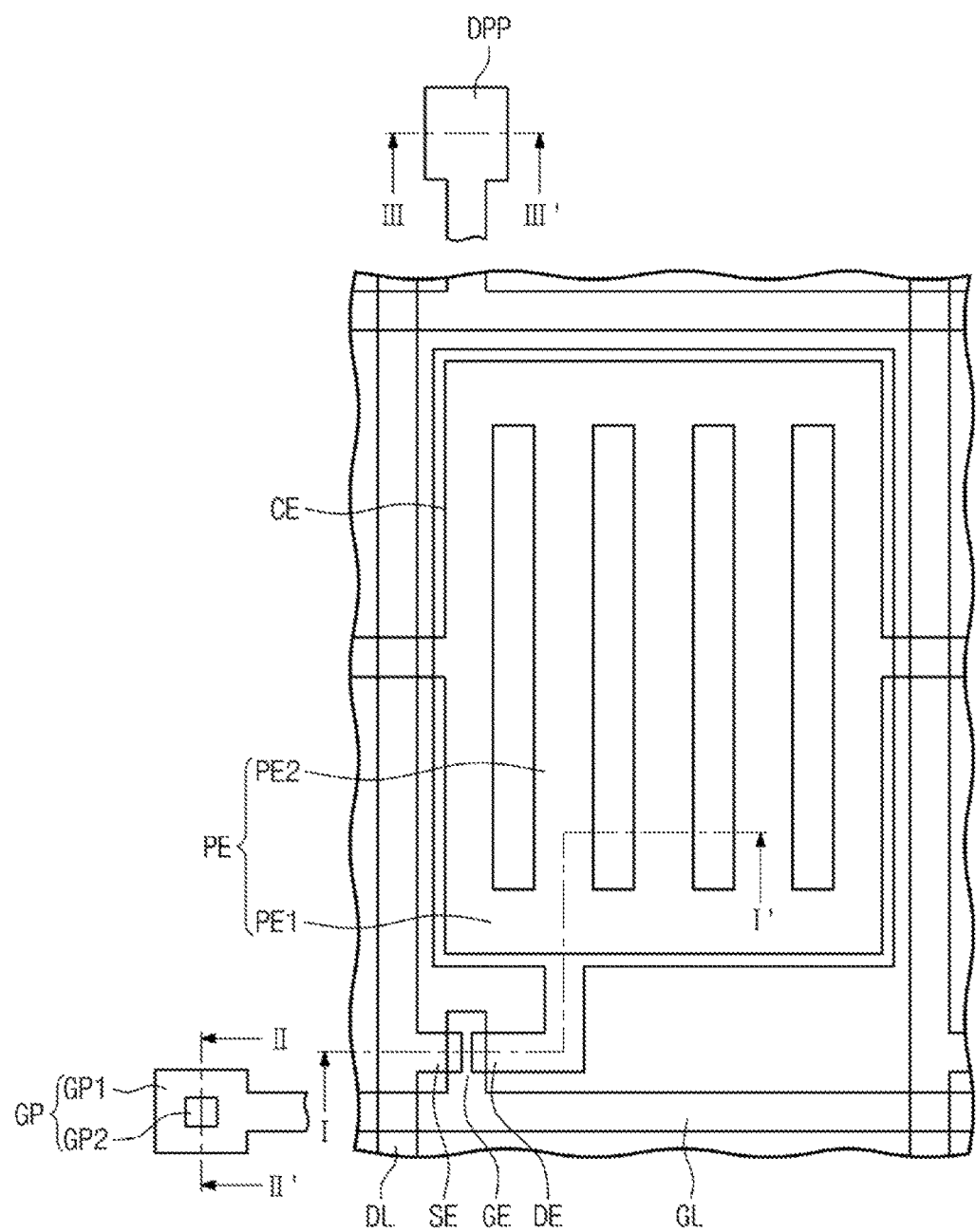
FIG. 6A is a plan view illustrating a result of a third photolithography process of a method of manufacturing a display apparatus according to an exemplary embodiment.

FIG. 6A is a plan view illustrating a result of a third photolithography process of a method of manufacturing a display apparatus according to an exemplary embodiment, and FIG. 6B is a cross-sectional view taken along the lines I-I', II-II, and III-III' shown in FIG. 6A.

Figure 7A:
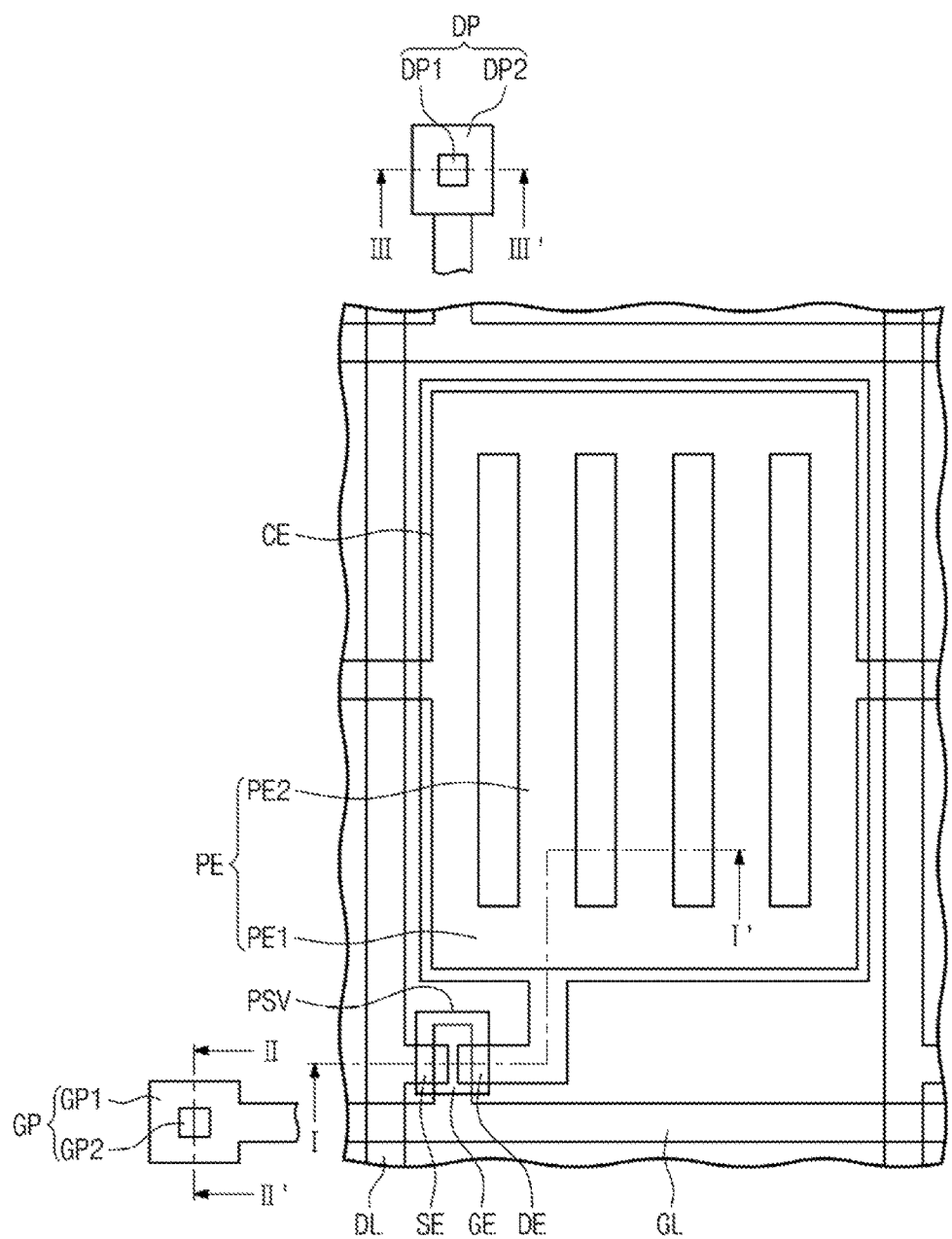
FIG. 7A is a plan view illustrating the result of a fourth photolithography process of a method of manufacturing a display apparatus according to an exemplary embodiment.
Figure 7B:
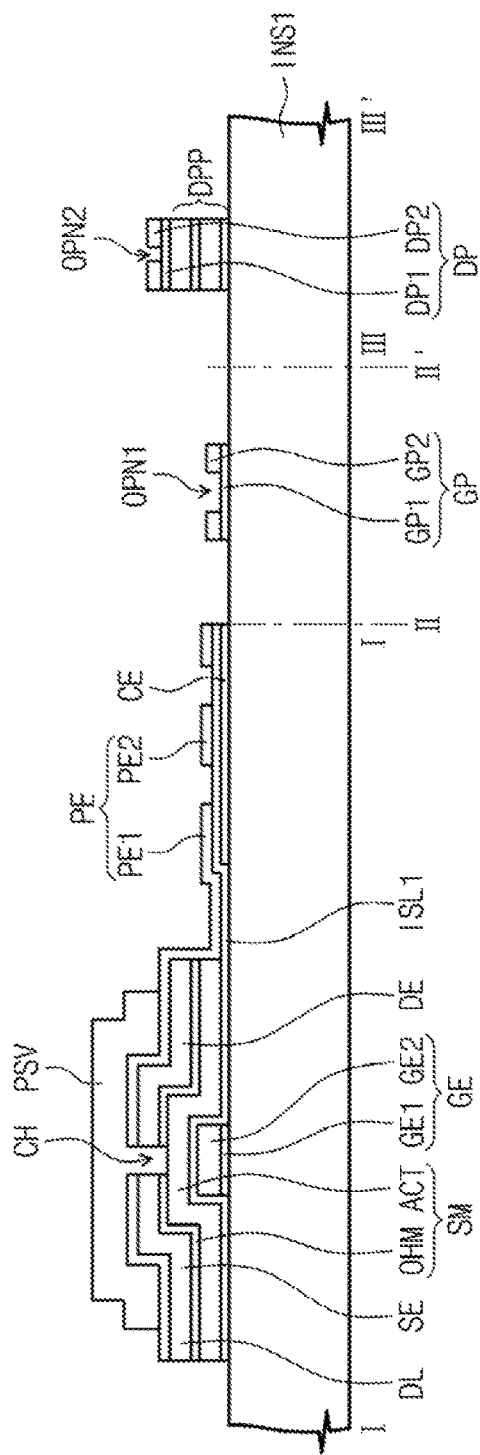
FIG. 7B is a cross-sectional view taken along the lines I-I', II-II, and III-III' shown in FIG. 6A.

FIG. 7A is a plan view illustrating a result of a fourth photolithography process of a method of manufacturing a display apparatus according to an exemplary embodiment, and FIG. 7B is a cross-sectional view taken along the lines I-I', II-II, and III-III' shown in FIG. 6A.

In FIGS. 4B to 4F, 5B, 6B, and 7B, the display area DA including the thin film transistor, the area in which the gate pad GP is formed, and the area in which the data pad DP is formed are sequentially presented.

Referring to FIGS. 4A to 4F, a first wire pattern is formed using a first photolithography process. The first wire pattern includes the gate line GL, the gate electrode GE, the common electrode CE, and the gate pad GP.

In general, to form the first wire pattern, a first conductive layer CDL1, a second conductive layer CDL2, and a photoresist layer PR are sequentially stacked. Then, when the photoresist layer PR is exposed and developed to form photoresist layer patterns PR1, PR2, and PR3 (FIGS. 4C and 4D), the first and second conductive layers CDL1 and CDL2 are patterned using the photoresist layer patterns PR1, PR2, and PR3 as masks, thereby forming the first wire pattern.

The first photolithography process is performed as follows.

Figure 4B:
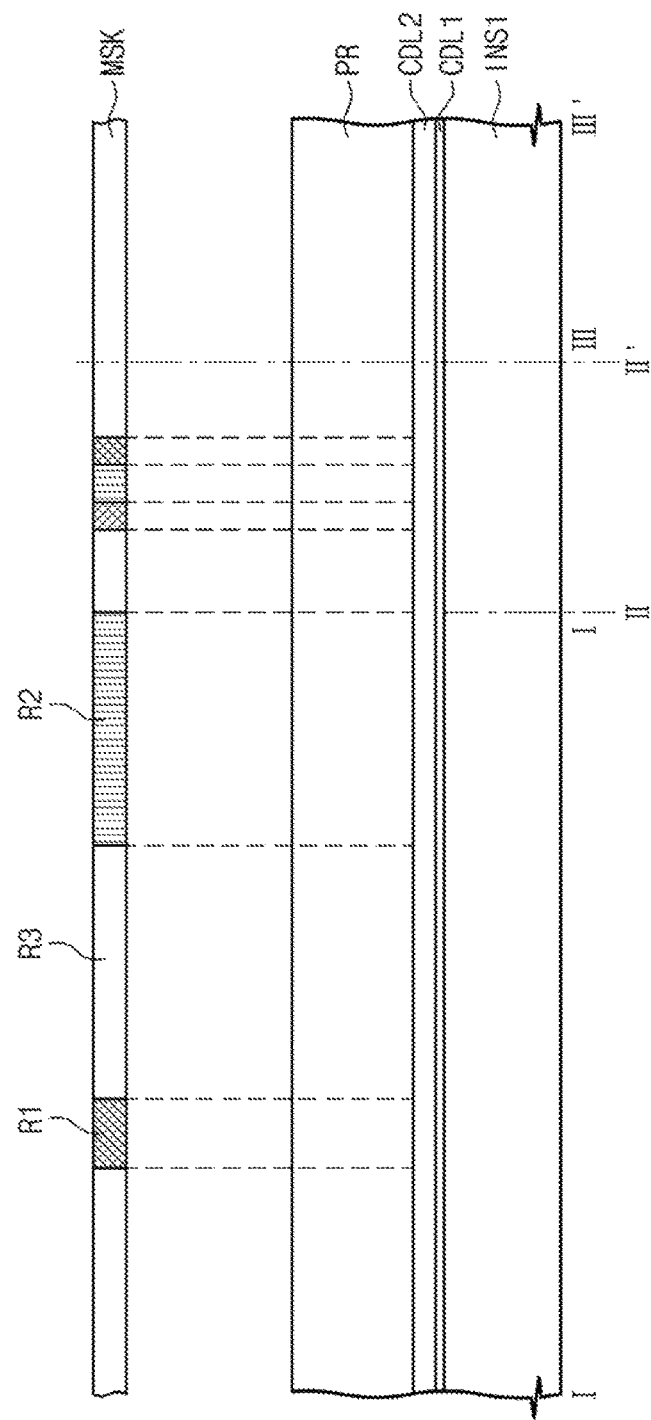
Figure 4D:
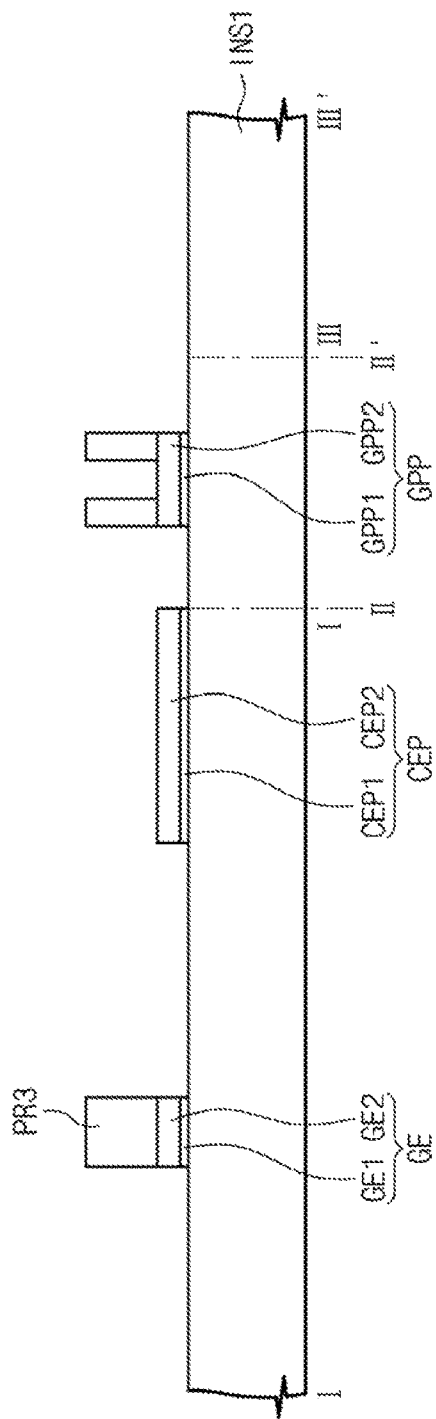

As shown in FIG. 4B, the first conductive layer CDL1, the second conductive layer CDL2, and the photoresist layer PR are sequentially stacked on the first insulating substrate INS1. The first conductive layer CDL1 may be formed of the first conductive material, and the second conductive layer CDL2 may be formed of the second conductive material. The first conductive material may include the transparent conductive material, such as, for example, indium tin oxide, indium zinc oxide, indium tin zinc oxide, etc. The second conductive material may include the metal material, for example, copper, molybdenum, aluminum, tungsten, chromium, titanium, or an alloy thereof.

Then, the photoresist layer PR is exposed and developed using a first mask MSK. The first mask MSK is a slit mask or a diffraction mask, and includes a first region R1 that blocks the light, a second region R2 in which a slit pattern or a diffraction pattern is formed to transmit a portion of the light and block a remaining portion of the light, and a third region R3 that transmits the light.

Thus, the upper surface of the first substrate SUB1 is disposed under one of the first, second, or third regions R1, R2, and R3 of the first mask MSK, and thus the upper surface of the first substrate SUB1 is divided into three regions corresponding to the first, second, and third regions R1, R2, and R3, respectively. Therefore, the three regions of the first substrate SUB1 will be referred to as the first, second, and third regions R1, R2, and R3.

When the photoresist layer PR is developed, a first photoresist pattern PR1 and a second photoresist pattern PR2, which each have a predetermined thickness, remain in the first region R1 and the second region R2, respectively, and the photoresist layer PR is completely removed from the third region R3. Accordingly, the surface of the second conductive layer CDL2 is exposed in the third region R3. In addition, because the amount of the light passing through the second region R2 of the first mask MSK is larger than the amount of the light passing through the first region R1 of the first mask MSK, the second photoresist pattern PR2 has a thickness that is thinner than the thickness of the first photoresist pattern PR1.

In the present exemplary embodiment, a positive-type photoresist layer in which the exposed portion of the photoresist layer is removed is used to form the photoresist layer patterns, but the photoresist layer should not be limited to the positive-type. That is, a negative-type photoresist layer in which an exposed portion of the photoresist layer remains may alternatively be used to form the photoresist layer patterns.

Next, the first conductive layer CDL1 and the second conductive layer CDL2 are selectively removed using the first photoresist layer pattern PR1 and the second photoresist layer pattern PR2 as the masks.

Accordingly, the gate line GL, the gate electrode GE, a common electrode pattern CEP, and a gate pad pattern GPP are formed in the display area DA.

The gate electrode GE includes the first gate electrode GE1 formed of the first conductive material and the second gate electrode GE2 formed of the second conductive material and disposed on the first conductive material. The common electrode pattern CEP includes a first common electrode pattern CEP1 formed of the first conductive material and a second common electrode pattern CEP2 formed of the second conductive material and disposed on the first common electrode pattern CDP1.

The gate pad pattern GPP is formed in the pad area PDA. The gate pad pattern GPP includes a first gate pad pattern GPP1 formed of the first conductive material and a second gate pad pattern GPP2 formed of the second conductive material and disposed on the first gate pad pattern GPP1.

Next, when a portion of the first photoresist layer pattern PR1 and the second photoresist layer pattern PR2 are removed by, for example, an ashing process or an etch back process, the second photoresist layer pattern PR2 on the common electrode pattern CEP is completely removed, so that the second common electrode pattern CEP2 is exposed. In addition, the second photoresist layer pattern PR2 in a predetermined region on the gate pad pattern GPP is completely removed, and thus the second gate pad pattern GPP2 is partially exposed. In this case, a top portion of the first photoresist layer pattern PR1 is removed, such portion has a thickness of the second photoresist layer pattern PR2, thereby forming a photoresist layer pattern PR3. As a result, the third photoresist layer pattern PR3 remains only in the first region R1.

Figure 4E:
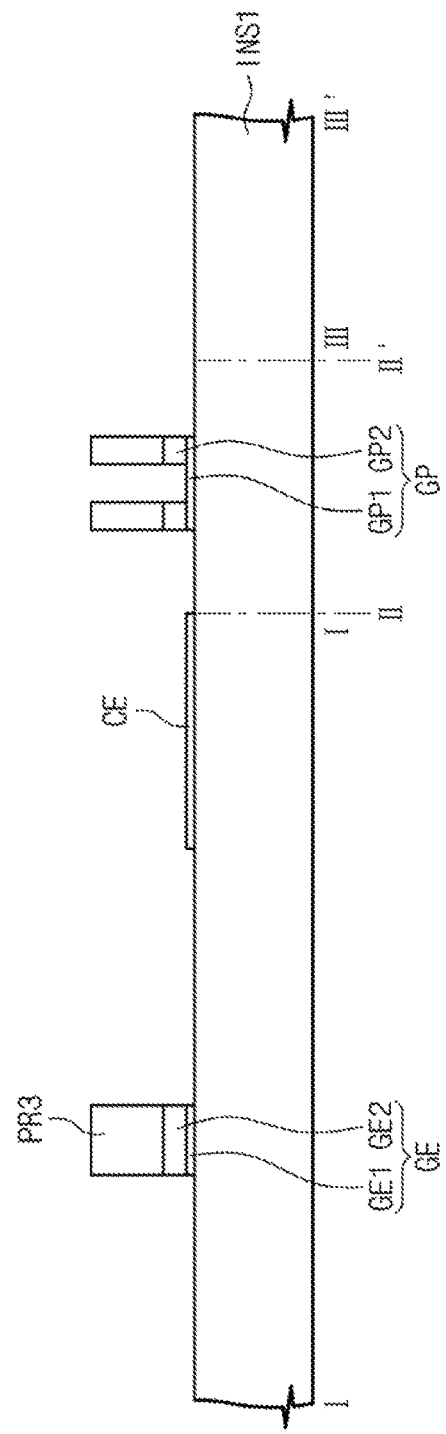

Next, as shown in FIG. 4E, the second common electrode pattern CEP2 and a portion of the second gate pad pattern GPP2 are removed using the third photoresist layer pattern PR3. Thus the common electrode CE and the gate pad GP including the first gate pad part GP1 and the second gate pad part GP2 are formed.

Figure 4F:
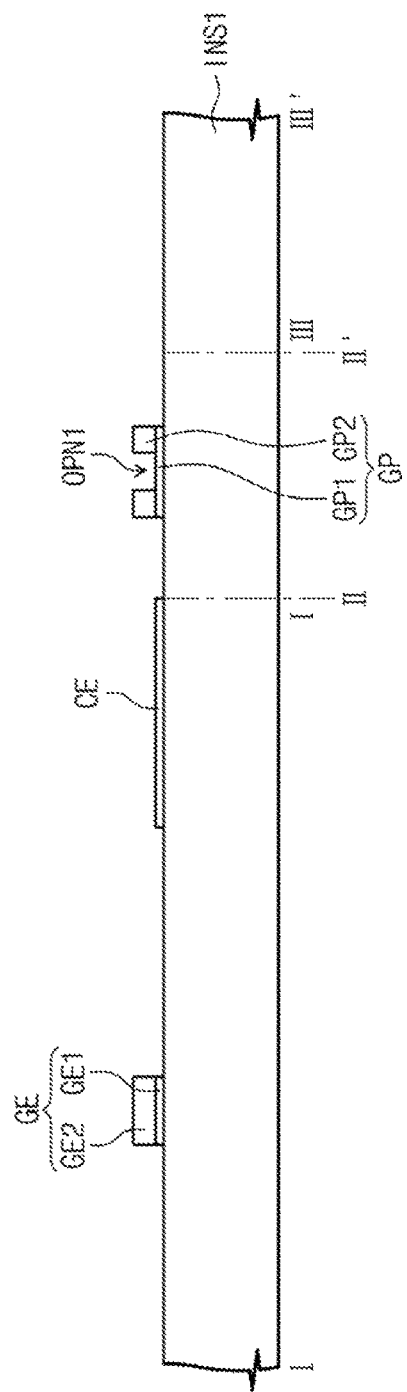

As shown in FIG. 4F, the third photoresist layer pattern PR3 is then removed.

As a result, the gate electrode GE, the gate line GL, and the common electrode CE are formed in the display area DA through the first photolithography process, and the gate pad GP is formed in the pad area PDA through the first photolithography process.

Referring to FIGS. 5A and 5B, the first insulating layer ISL1 is formed on the first insulating substrate INS1 on which the first wire pattern is formed, and a second wire pattern is formed on the first insulating layer ISL1 using the second photolithography process. The second wire pattern includes the data line DL, a thin film transistor electrode pattern TEP, and a data pad pattern DPP.

To form the second wire pattern, a first semiconductor material, a second semiconductor material, and a third conductive material are sequentially formed on the first insulating substrate INS1, a first semiconductor layer (not shown) including the first semiconductor material, a second semiconductor layer (not shown) including the second semiconductor material, and a third conductive layer (not shown) including the third conductive material are selectively etched using a second mask (not shown).

The first semiconductor material may include, for example, amorphous silicon or polycrystalline silicon. The second semiconductor material may include, for example, amorphous silicon doped with a dopant or polycrystalline silicon. The second semiconductor material may be formed by injecting a dopant into the amorphous silicon or the polycrystalline silicon. The conductive material may be a metal material including, for example, copper, molybdenum, aluminum, tungsten, chromium, titanium, or an alloy thereof. In addition, the third conductive material may be the same material as the second conductive material.

Accordingly, the thin film transistor electrode pattern TEP is formed in the display area DA and includes the active layer ACT formed of the first semiconductor material on the first insulating layer ISL1, an ohmic contact pattern OHMP formed of the second semiconductor material on the active layer ACT, and a source/drain electrode pattern EP formed of the third conductive material on the ohmic contact pattern OHMP. The active layer ACT, the ohmic contact pattern OHMP, and the source/drain electrode pattern EP are formed through a single process using the second mask, and thus the active layer ACT, the ohmic contact pattern OHMP, and the source/drain electrode pattern EP have the same shape and are stacked on the same position when viewed in a plan view.

The data pad pattern DPP, which is formed by patterning the first semiconductor material, the second semiconductor material, and the conductive material, is formed in the pad area PDA.

Referring to FIGS. 6A and 6B, a fourth conductive layer (not shown) is formed using a fourth conductive material on the first insulating substrate INS1 on which the second wire pattern is formed, and a third wire pattern is formed using a third photolithography process. The fourth conductive material may include, for example, indium thin oxide, indium zinc oxide, or indium tin zinc oxide.

When the fourth conductive layer, which is formed of the fourth conductive material, and a portion of the thin film transistor electrode pattern TEP are selectively pattern using a third mask, the third wire pattern is formed. In detail, the fourth conductive layer and a portion of the source/drain electrode pattern EP and a portion of the ohmic contact pattern OHMP are etched using the third mask.

As a result, the source electrode SE and the drain electrode DE are formed in the display area DA by the etching of a portion of the source/drain electrode pattern EP, and the pixel electrode PE, which includes the fourth conductive material on the drain electrode DE, is also formed. During the above-mentioned process, the ohmic contact pattern OHMP between the source electrode SE and the drain electrode DE is removed, and a portion of the upper portion of the active layer ACT is exposed while being etched. The exposed portion of the active layer ACT that is between the source electrode SE and the drain electrode DE serves as the channel portion CH.

Referring to FIGS. 7A and 7B, a second insulating layer (not shown) is formed using a second insulating material on the first insulating substrate INS1 on which the channel portion CH is formed. The second insulating material may include, for example, silicon nitride or silicon oxide. Then, a portion of the first insulating layer ISL1 and a portion of the second insulating layer are etched through a fourth photolithography process using a fourth mask, so that the passivation layer PSV and the second data pad part DP2 are formed. In addition, the first insulating layer ISL1 is removed from the area in which the gate pad GP is formed, thereby exposing a portion of the upper portion of the first gate pad part GP1 and the upper surface of the second gate pad part GP2 in the pad area PDA.

The passivation layer PSV covers the channel portion CH to protect the channel portion CH. The second data pad part DP2 is etched to have the second opening OPN2 through which a portion of the first data pad part DP1 is exposed.

To manufacture the display apparatus, the first substrate SUB1 manufactured by the above-described method is positioned opposite to the second substrate SUB2 on which the color filters CF are formed, and the liquid crystal layer LC is disposed between the first substrate SUB1 and the second substrate SUB2.

As described above, in the plane-to-line switching mode display apparatus, the first substrate SUB1 may be manufactured by using the first to fourth photolithography processes using, respectively, the first to fourth masks. In addition, the gate line GL, the gate electrode GE, the common electrode pattern and the gate pad pattern are simultaneously formed on the first insulating substrate INS1 through the first photolithography process. Therefore, among the first to fourth photolithography processes, the slit mask or the diffraction mask is used only in the first photolithography process. Accordingly, only one slit or diffraction mask is used to form the first substrate, and no additional photolithography processes other than the first to fourth processes are used, or additional masks other than the first to fourth masks are used, to form the first substrate. Therefore, the number of the slit masks or diffraction masks may be reduced in this manufacturing method as compared to the conventional manufacturing method of a PLS mode display apparatus, which uses two or more slit masks or diffraction masks, and the number of to photolithography processes may also be reduced. As a result, the manufacturing costs are reduced. Further, because no additional ashing or cleaning process is required to manufacture the display apparatus, the manufacturing process is greatly simplified.

Figure 8:
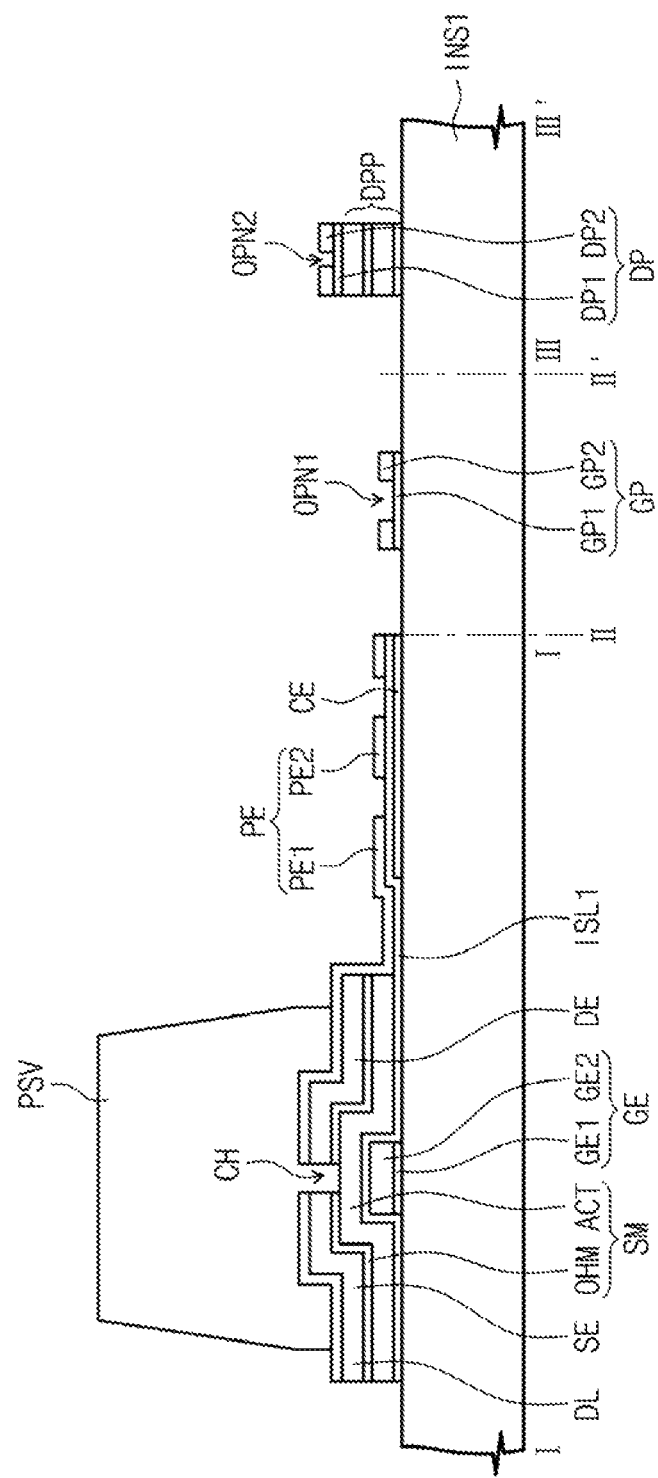
FIG. 8 is a cross-sectional view showing a display apparatus according to another exemplary embodiment.

FIG. 8 is a cross-sectional view showing a display apparatus according to another exemplary embodiment. FIG. 8 shows only the first substrate of the display apparatus. In FIG. 8, the same reference numerals denote the same elements as in FIGS. 1 to 3, and thus duplicative description of the same elements will be omitted.

Referring to FIG. 8, the passivation layer PSV may be formed to have a thickness corresponding to a cell gap between the first substrate SUB1 and the second substrate SUB2. Thus, the passivation layer PSV may cover the channel portion CH to protect the channel portion CH and also serve as the spacer between the first substrate SUB1 and the second substrate SUB2.

The passivation layer PSV may be formed together with the second data pad part DP2 using the fourth photolithography process. The method of forming the passivation layer PSV with the second data pad part DP2 is as follows. The second insulating layer (not shown) and the photoresist layer are sequentially formed on the first insulating substrate INS1 on which the channel portion CH is formed. Then, the photoresist layer is exposed and developed using the slit mask or the diffraction mask. Thus, photoresist patterns having different thicknesses are formed in different regions. As shown in FIG. 4B, when the photoresist layer PR is developed, a first photoresist pattern PR1 and a second photoresist pattern PR2, which each have a predetermined thickness, remain in the first region R1 and the second region R2, respectively, and the photoresist layer PR is completely removed from the third region R3. Accordingly, the surface of the second conductive layer CDL2 is exposed in the third region R3. In addition, because the amount of the light passing through the second region R2 of the first mask MSK is larger than the amount of the light passing through the first region R1 of the first mask MSK, the second photoresist pattern PR2 has a thickness that is thinner than the thickness of the first photoresist pattern PR1.

The first insulating layer ISL1 and the second insulating layer formed under the photoresist patterns are selectively etched using the photoresist patterns as a mask.

Accordingly, the passivation layer PSV is formed above the gate electrode GE to cover the channel portion CH, and the second data pad pattern is formed on the first data pad part DP1. The first insulating layer ISL1 in the area in which the gate pad GP is formed is removed from the pad area PDA, and thus the portion of the upper surface of the first gate pad part GP1 and the upper surface of the second gate pad part GP2 are exposed.

Then, an ashing or etch back process is used to remove the portion of the photoresist pattern. The portion of the second data pad pattern is selectively removed using the remaining photoresist pattern as the mask, to thereby form the second data pad part DP2.

As described above, the spacer may be formed using the fourth photolithography process during manufacture of the first substrate. Accordingly, the additional process of forming the spacer may be omitted in the present exemplary embodiments, thereby simplifying the manufacturing process of the display apparatus, shortening the process time of the manufacturing method, and reducing the manufacturing cost of the display apparatus.

Although the exemplary embodiments have been described, it is understood that the present invention should not be limited to these exemplary embodiments but various changes and modifications can be made by one ordinary skilled in the art within the spirit and scope of the disclosure.

For instance, the display apparatus should not be limited to the PLS mode display apparatus. That is, the manufacturing method may be applied to an in-plane switching mode display apparatus.

What is claimed is:

1. A method of manufacturing a display apparatus, comprising:
    performing a first photolithography process using a first mask to form a first wire pattern including a gate line, a gate electrode, and a common electrode on a substrate;
    forming an insulating layer on the substrate to cover the first wire pattern;
    performing a second photolithography process using a second mask to form a second wire pattern including a data line and a thin film transistor electrode pattern on the insulating layer;
    performing a third photolithography process using a third mask to form a third wire pattern including a source electrode, a drain electrode, and a pixel electrode on the substrate and form a channel portion between the source electrode and the drain electrode; and
    performing a fourth photolithography process using a fourth mask to form a passivation layer that covers the channel portion.

2. The method of claim 1, wherein the first mask is at least one of a slit mask and a diffraction mask.

3. The method of claim 2, wherein the first photolithography process comprises:
    sequentially depositing a first conductive material and a second conductive material on the substrate to form a first conductive layer and a second conductive layer; and
    etching a portion of the first conductive layer and a portion of the second conductive layer using the first mask.

4. The method of claim 3, wherein the etching of the first and second conductive layers comprises:

forming a photoresist layer on the second conductive layer;

exposing and developing the photoresist layer using the at least one of the slit mask and the diffraction mask to form a first photoresist layer pattern having a first thickness in a first region and a second photoresist layer having a second thickness smaller than the first thickness in a second region different from the first region;

etching a portion of the first photoresist layer pattern and a portion of the second photoresist layer pattern using the first and second photoresist layer patterns as a mask;

ashing the first and second photoresist layer patterns to form a third photoresist layer pattern having a third thickness smaller than the first thickness in the first region; and etching the second conductive layer using the third photoresist layer pattern as a mask to form the gate line and the gate electrode in the first region and the common electrode in the second region.

5. The method of claim 1, wherein the second photolithography process comprises:

sequentially forming a first semiconductor layer including amorphous silicon or polycrystalline silicon, a second semiconductor layer including amorphous silicon doped with a dopant or polycrystalline silicon doped with the dopant, and a third conductive layer including a third conductive material on the insulating layer; and etching the first semiconductor layer, the second semiconductor layer, and the third conductive layer using the second mask to form an active layer, an ohmic contact pattern, and a semiconductor electrode pattern.

6. The method of claim 5, wherein the third photolithography process is to each a portion of the ohmic contact pattern and a portion of the semiconductor electrode pattern using the third mask to form the source electrode, the drain electrode spaced apart from the source electrode, and the channel portion.

7. The method of claim 1, wherein the substrate comprises a display area in which the pixels are arranged to display an image and a pad area positioned adjacent to at least one side of the display area, and the first photolithography process further comprises forming a gate pad disposed in the pad area and connected to the gate line.

8. The method of claim 7, wherein the forming of the gate pad comprises:

forming a first gate pad part on the substrate; and forming a second gate pad part on the first gate pad part, the second gate pad part including a first opening to expose a portion of an upper surface of the first gate pad part.

9. The method of claim 8, wherein the first gate pad part is formed of a first conductive material and the second gate pad part is formed of a second conductive material.

10. The method of claim 7, wherein the third photolithography process further comprises forming a first data pad part disposed in the pad area and connected to the data line, and the fourth photolithography process further comprises forming a second data pad part disposed on the first data pad part and including a second opening to expose a portion of an upper surface of the first data pad part.

11. The method of claim 10, wherein the second data pad part is formed of a same material as the passivation layer.

* * * * *